(12) United States Patent
Shigehara et al.

(10) Patent No.: US 6,462,611 B2
(45) Date of Patent: Oct. 8, 2002

(54) TRANSMISSION GATE

(75) Inventors: Hiroshi Shigehara, Tokyo-to; Masanori Kinugasa, Yokohama; Toshinobu Hisamoto, Oita, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/029,299

(22) Filed: Dec. 28, 2001

(65) Prior Publication Data

US 2002/0053941 A1 May 9, 2002

Related U.S. Application Data

(60) Continuation of application No. 09/699,488, filed on Oct. 31, 2000, now Pat. No. 6,335,653, which is a continuation of application No. 09/436,632, filed on Nov. 9, 1999, now Pat. No. 6,169,443, which is a division of application No. 09/064,814, filed on Apr. 23, 1998, now Pat. No. 6,020,778.

(30) Foreign Application Priority Data

Apr. 24, 1997 (JP) .............................................. 9-107601

(51) Int. Cl.[7] ................................................. H03K 3/01
(52) U.S. Cl. ........................................ 327/534; 327/404
(58) Field of Search ................................. 327/365, 403, 327/404, 427, 534

(56) References Cited

U.S. PATENT DOCUMENTS

| | | | |
|---|---|---|---|
| 5,332,916 A | 7/1994 | Hirai | 257/369 |
| 5,617,055 A | 4/1997 | Confalonieri et al. | 327/404 |
| 5,689,209 A | 11/1997 | Williams et al. | 327/425 |
| 5,767,733 A | 6/1998 | Grugett | 327/534 |
| 5,963,080 A | 10/1999 | Miske et al. | 327/534 |
| 6,008,689 A | 12/1999 | Au et al. | 327/534 |
| 6,154,085 A | 11/2000 | Ramakrishnan | 327/404 |
| 6,194,952 B1 | 2/2001 | Shigehara | 327/534 |

*Primary Examiner*—Jeffrey Zweizig
(74) *Attorney, Agent, or Firm*—Doley & Lardner

(57) ABSTRACT

Two terminals of each of transistors (P1, N1) are connected between two terminals (A, B). A body effect compensation circuit (COMP-P1) for the transistor (P1) and a body effect compensation circuit (COMP-N1) for the transistor (N1) are arranged. The back gates of transistors (P1P, P2P) in the circuit (COMP-P1) and transistors (P1N, P2N) in the circuit (COMP-N1) are commonly connected to the back gate of the transistor (P1). The back gates of transistors (N1N, N2N) in the circuit (COMP-N1) and transistors (N1P, N2P) in the circuit (COMP-P1) are commonly connected to the back gate of the transistor(N1). With this structure, in transferring a signal from one terminal (A or B) to the other terminal (B or A) or vice versa, the signal potential is transferred to the back gates of the transistors (P1, N1) at a high speed to increase the signal transfer speed.

3 Claims, 12 Drawing Sheets

US 6,462,611 B2

TRANSMISSION GATE

This is a Continuation Application of U.S. Ser. No. 09/699,488, filed Oct. 31, 2000, now U.S. Pat. No. 6, 335, 653, which is a Continuation Application of U.S. Ser. No. 09/436,632, filed Nov. 9, 1999, now U.S. Pat. No 6, 169, 443, which is a Divisional Application of U.S. Ser. No. 09/064,814, filed Apr. 23, 1998 now U.S. Pat. No. 6,020, 778. This application claims priority to Japanese Patent Application No. 9-107601, filed Apr. 24, 1997.

BACKGROUND OF THE INVENTION

The present invention relates to a transmission gate and, more particularly, to a transmission gate having a so-called body effect compensation circuit.

In a semiconductor integrated circuit, a transmission gate is used as a bus exchanger for switching transfer of signals between buses. To decrease the ON resistance of a CMOS transmission gate, addition of a body effect compensation circuit is proposed in the following reference:

Yasoji Suzuki, "How To Use CMOS Circuit (1)", Kogyo Chosakai Publishing Co., Ltd., pp. 92–93, FIG. 4.18.

The body effect is a phenomenon that, as for, e.g., an nMOS transistor, the potential difference Vbs between the back-gate voltage Vb and the source potential Vs is negatively changed by the voltage of an input signal to increase the threshold voltage, and as for a pMOS transistor, the potential difference Vbs is positively changed to increase the threshold voltage. Upon occurrence of this phenomenon, a value obtained by subtracting the threshold voltage from the voltage across the gate and source decreases, the driving ability of the n-channel MOS transistor decreases, and the signal transfer resistance increases.

A gate prepared by adding a body effect compensation circuit to an nMOS transistor that is disclosed in the above reference is a unilateral transmission gate. FIG. 8 shows a bilateral transmission gate to which a similar body effect compensation circuit is added. The drain and source of a p-channel MOS transistor P1 and those of an n-channel MOS transistor N1 are parallel-connected between bilateral input/output terminals A and B. The conductive states of the transistors P1 and N1 are controlled by an externally input enable signal/EN. An enable signal VGP inverted by an inverter INV1 is input to the gate of the transistor P1, whereas an enable signal/VGN inverted by the inverter INV1 and an inverter INV2 is input to the gate of the transistor N1. Upon reception of a high-level enable signal/EN, both the transistors P1 and N1 are turned on to render the input/output terminals A and B conductive.

A p-well Pw where the n-channel MOS transistor N1 is formed, and a p-well Pw where n-channel MOS transistors N1N and N2N are formed are the same or electrically connected to each other. With this structure, the back gate Pw of the transistor N1 and the back gates of the transistors N1N and N2N have the same potential. The drains and sources of the transistors N1N and N2N are series-connected between the input/output terminals A and B. The drain and source of the transistor N1N are connected to those of a p-channel MOS transistor P1N, and the drain and source of the transistor N2N are connected to those of a p-channel MOS transistor P2N. The enable signal /VGN is input to the gates of the transistors N1N and N2N, while the enable signal VGP is input to the gates of the transistors P1N and P2N. The drain of a transistor N2 is connected to the back gate Pw of the transistor N1, its gate receives the enable signal VGP, and its source is grounded.

More specifically, as shown in FIG. 9, the p-well Pw and an n-well Nw are formed in the surface of an n-type semiconductor substrate 101. N-type diffusion layers ND1 of the n-channel MOS transistors N1, N1N, and N2N are formed in the same p-well Pw or separate p-wells Pw electrically connected to each other. N-type diffusion layers of the n-channel MOS transistors N2 is formed in a p-well being electrically independent on the p-well for n-channel MOS transistors N1, N1N, N2N. P-type diffusion layers PD3 of the p-channel MOS transistors P1, P1N, and P2N are formed in the same n-well Nw or separate n-wells Nw electrically connected to each other. The potential of the n-well Nw must be set to the power supply voltage Vcc, and is applied with the voltage Vcc via n-type diffusion layers ND2 and ND3. The potential of the p-well Pw for the n-channel MOS transisters N1, N1N, N2N need not be set to the ground voltage, and is applied with a voltage Vpw corresponding to an input voltage to the transmission gate via p-type diffusion layers PD1 and PD2. In contrast, the p-well for the n-channel MOS transistor N2 is set to the ground potential.

In the n-channel MOS transistors N1, the potential difference between the back gate and the source can be set to almost 0 by the body effect compensation circuit, and the above-described body effect can be compensated. As for the p-channel MOS transistor P1, however, no body effect can be compensated because the back gate is fixed to the power supply voltage Vcc.

If an n-well is formed in a p-type semiconductor substrate in contrast to the circuit shown in FIGS. 8 and 9, a body effect compensation circuit made up of p-channel MOS transistors P1P and P2P formed in the same n-well Nw or electrically connected n-wells Nw, and nMOS transistors N1P and N2P can be added to only the p-channel MOS transistor P1, as shown in FIG. 10. As for the n-channel MOS transistor N1, no body effect is compensated.

FIG. 11 shows a semiconductor substrate 111 having a triple well structure. A deep n-well D-Nw is formed in the surface of the p-type semiconductor substrate 111, and a p-well D-Pw is formed in the surface of the n-well D-Nw. An n-channel MOS transistor is formed in the p-well D-Pw. A p-well Pw is formed in the surface of the semiconductor substrate 111, and an n-well Nw is formed in the surface of the p-well Pw. P-type diffusion layers PD13 of a p-channel MOS transistor are formed in the n-well Nw.

The outer n-well D-Nw is set to the power supply voltage Vcc, and the p-well Pw is grounded. The potential of the p-well D-Pw in the n-well D-Nw is set to a voltage Vdpw on the ground potential corresponding to an input voltage, and the potential of the n-well Nw in the p-well Pw is similarly set to a voltage Vnw or the power supply voltage Vcc corresponding to an input voltage. With this structure, the back gate of the n-channel MOS transistor need not be set to the ground potential, and the back gate of the p-channel MOS transistor need not be set to the power supply voltage Vcc, either. In this structure, as shown in FIG. 12, p-channel MOS transistors P1P, P2P and P2 and n-channel MOS transistors N1P and N2P constitute a body effect compensation circuit for a p-channel MOS transistor P1, whereas n-channel MOS transistors N1N, N2N and N2 and p-channel MOS transistors P1N and P2N constitute a body effect compensation circuit for an n-channel MOS transistor N1. In this circuit arrangement, the drain of a p-channel MOS transistor P2 is connected to the back gate Nw of the transistor P1, its gate receives a gate signal VGN, and its source is connected to the power supply voltage Vcc terminal. The drain of an n-channel MOS transistor N2 is connected to the back gate Pw of the transistor N1, its gate receives a signal VGP, and its source is grounded.

In the arrangement shown in FIG. 12, however, the following phenomenon occurs. The back gates of the n-channel MOS transistors N1P and N2P are fixed to the ground potential, and the back gates of the p-channel MOS transistors P1N and P2N are fixed to the voltage Vcc. Accordingly, the four transistors are affected by the body effect to decrease their driving abilities and increase their signal transfer resistances. This decreases the transfer speed of the potential at the input/output terminal A or B to the back gate Nw of the p-channel MOS transistor P1 and the back gate Pw of the n-channel MOS transistor N1. That is, when a signal is input to the input/output terminal A or B, the rate of change in back-gate potential which follows the potential of this signal decreases, and a potential between the backgate and the source occurs, so that the body effect transitionally acts on the p-channel MOS transistor P1 and the n-channel MOS transistor N1. As a result, the signal transfer speed from the input/output terminal A or B to the input/output terminal B or A decreases.

As described above, in the transmission gate, the signal transfer speed decreases owing to the body effect.

SUMMARY OF THE INVENTION

It is, therefore, an object of the present invention to provide a transmission gate capable of increasing the signal transfer speed.

According to the present invention, there is provided a transmission gate comprising first and second terminals, a first transistor of a first conductivity type which has a drain and source connected between the first and second terminals and is rendered conductive by a first signal, a second transistor of a second conductivity type which has a drain and source connected between the first and second terminals and is rendered conductive by a second signal corresponding to an inverted signal of said first signal, a first body effect compensation circuit for reducing the difference between a potential of a back gate and a potential of the source of the first transistor when the first transistor is ON, and a second body effect compensation circuit for reducing the difference between a potential of a back gate and a potential of the source of the second transistor when the second transistor is ON, the first body effect compensation circuit including a third transistor of the second conductivity type having a drain and source connected between the back gate of the first transistor and the first terminal, and a fourth transistor of the second conductivity type having a drain and source connected between the back gate of the first transistor and the second terminal, and the second body effect compensation circuit including a fifth transistor of the first conductivity type having a drain and source connected between the back gate of the second transistor and the first terminal, and a sixth transistor of the first conductivity type having a drain and source connected between the back gate of the second transistor and the second terminal, wherein back gates of both the third and fourth transistors are connected to the back gate of the second transistor, and back gates of both the fifth and sixth transistors are connected to the back gate of the first transistor.

The third and fourth transistors may be rendered conductive by the second signal, and the fifth and sixth transistors are rendered by the first signal.

The first body effect compensation circuit may connect the back gate of the first transistor to a first potential terminal when the first transistor is OFF, and the second body effect compensation circuit may connect the back gate of the second transistor to a second potential terminal when the second transistor is OFF.

The first body effect compensation circuit may further comprise a seventh transistor of the first conductivity type which has a drain and source connected between the first terminal and the back gate of the first transistor and receives the first signal at a gate, an eighth transistor of the first conductivity type which has a drain and source connected between the back gate of the first transistor and the second terminal and receives the first signal at a gate, and a ninth transistor of the first conductivity type which has a drain and source connected between the back gate of the first transistor and the first potential terminal and receives the second signal at a gate; the second body effect compensation circuit may further comprise a 10th transistor of the second conductivity type which has a drain and source connected between the first terminal and the back gate of the second transistor and receives the second signal at a gate, a 11th transistor of the second conductivity type which has a drain and source connected between the back gate of the second transistor and the second terminal and receives the second signal at a gate, and a 12th transistor of the second conductivity type which has a drain and source connected between the back gate of the second transistor and the second potential terminal and receives the first signal at a gate; and back gates of the seventh and eighth transistors may be connected to the back gate of the first transistor, a back gate of the ninth transistor may be connected to the first potential terminal, back gates of the 10th and 11th transistors may be connected to the back gate of the second transistor, and a back gate of the 12th transistor may be connected to the second potential terminal.

According to the present invention, there is provided a transmission gate comprising first and second terminals, a first transistor of a first conductivity type which has a drain and source connected between the first and second terminals and is rendered conductive by a first signal, a first body effect compensation circuit for reducing the difference between a potential of a well of the first conductivity type and a potential or potentials of at least one of the first and second terminals when the first transistor is ON, and a second body effect compensation circuit for reducing the difference between a potential of a back gate and a potential of the source of the first transistor when the first transistor is ON, the first body effect compensation circuit including a second transistor of a first conductivity type having a drain and source connected between the well and the first terminal, and a third transistor of the first conductivity type having a drain and source connected between the well and the second terminal, and the second body effect compensation circuit including a fourth transistor of the second conductivity type having a drain and source connected between the back gate of the first transistor and the first terminal, and a fifth transistor of the second conductivity type having a drain and source connected between the back gate of the first transistor and the second terminal, wherein back gates of both the second and third transistors are connected to the back gate of the first transistor, and back gates of both the fourth and fifth transistors are connected to the well.

The second and third transistors may be rendered conductive by the first signal, and said fourth and fifth transistors are rendered conductive by a second signal corresponding to an inverted signal of the first signal.

The first body effect compensation circuit may further comprise a sixth transistor of the second conductivity type which has a drain and source connected between the first terminal and the well and receives, at a gate, a second signal obtained by inverting the first signal, a seventh transistor of the second conductivity type which has a drain and source connected between the well and the second terminal and receives the second signal at a gate, and an eighth transistor of the second conductivity type which has a drain and source connected between the well and the first potential terminal and receives the first signal at a gate; the second body effect compensation circuit may further comprise a ninth transistor of the first conductivity type which has a drain and source connected between the first terminal and the back gate of the first transistor and receives the first signal at a gate, a 10th transistor of the first conductivity type which has a drain and source connected between the back gate of the first transistor and the second terminal and receives the first signal at a gate, and a 11th transistor of the first conductivity type which has a drain and source connected between the back gate of the first transistor and the second potential terminal and receives the second signals at a gate; and back gates of the sixth and seventh transistors may be connected to the well, a back gate of the eighth transistor may be connected to the first potential terminal, back gates of the ninth and 10th transistors may be connected to the back gate of the first transistor, and a back gate of the 11th transistor may be connected to the second potential terminal.

According to the present invention, there is provided a transmission gate comprising first and second terminals, first and second transistors, and first and second body effect compensation circuits, the first body effect compensation circuit including a third transistor of the second conductivity type having a drain and source connected between the back gate of the first transistor and the first terminal, and the second body effect compensation circuit including a fourth transistor of the first conductivity type having a drain and source connected between the back gate of the second transistor and the first terminal, wherein a back gate of the third transistor is connected to the back gate of the second transistor, and a back gate of the fourth transistor is connected to the back gate of the first transistor.

The first body effect compensation circuit may. comprise a fifth transistor of the first conductivity type which has a drain and source connected between the first terminal and the back gate of the first transistor and receives the first enable signal at a gate, and a sixth transistor of the first conductivity type which has a drain and source connected between the back gate of the first transistor and the first potential terminal and receives the second enable signal at a gate; the second body effect compensation circuit may comprise a seventh transistor of the second conductivity type which has a drain and source connected between the first terminal and the back gate of the second transistor and receives the second enable signal at a gate, and an eighth transistor of the second conductivity type which has a drain and source connected between the back gate of the second transistor and the second potential terminal and receives the first enable signal at a gate; and a back gate of the fifth transistor may be connected to the back gate of the first transistor, a back gate of the sixth transistor may be connected to the first potential terminal, a back gate of the seventh transistor may be connected to the back gate of the second transistor, and a back gate of the eighth transistor may be connected to the second potential terminal.

According to the present invention, there is provided a transmission gate comprising first and second terminals, first and second transistors, first and second body effect compensation circuits, the first body effect compensation circuit including a third transistor of the second conductivity type having a drain and source connected between the back gate of the first transistor and the first terminal, and a fourth transistor of the second conductivity type having a drain and source connected between the back gate of the first transistor and the second terminal, and the second body effect compensation circuit including a fifth transistor of the second conductivity type having a drain and source connected between the back gate of the second transistor and the back gate of the first transistor, and a sixth transistor of the first conductivity type having a drain and source connected between the back gate of the second transistor and the back gate of the first transistor. Back gates of both the third and fourth transistors may be connected to either one of first and second potential terminals, and a back gate of the sixth transistor is connected to the back gate of the first transistor.

The first body effect compensation circuit may comprise a seventh transistor of the first conductivity type which has a drain and source connected between the first terminal and the back gate of the first transistor and receives the first signal at a gate, an eighth transistor of the first conductivity type which has a drain and source connected between the back gate of the first transistor and the second terminal and receives the first signal at a gate, and a ninth transistor of the first conductivity type which has a drain and source connected between the back gate of the first transistor and one terminal of the first and second potential terminals and receives the second signal at a gate; the second body effect compensation circuit may comprise a 10th transistor of the second conductivity type which has a drain and source connected between the back gate of the second transistor and another terminal of the first and second potential terminals and receives the first signal at a gate; and back gates of the seventh and eighth transistors may be connected to the back gate of the first transistor, back gate of said ninth transistor is connected to one terminal of said first and second potential terminals, back gate of said ninth transistor is connected to one terminal of said first and second potential terminals, and a back gate of the 10th transistor may be connected to another terminal of the first and second potential terminals.

Back gates of both the third, fourth and fifth transistors may be connected to the back gate of the second transistor, and a back gate of the sixth transistor is connected to the back gate of the first transistor.

The first body effect compensation circuit may comprise a seventh transistor of the first conductivity type which has a drain and source connected between the first terminal and the back gate of the first transistor and receives the first signal at a gate, an eighth transistor of the first conductivity type which has a drain and source connected between the back gate of the first transistor and the second terminal and receives the first signal at a gate, and a ninth transistor of the first conductivity type which has a drain and source connected between the back gate of the first transistor and the first potential terminal and receives the second signal at a gate; the second body effect compensation circuit may further comprise a 10th transistor of the second conductivity type which has a drain and source connected between the back gate of the second transistor and the second potential terminal and receives the first signal at a gate; a back gate of said ninth transistor is connected to said first potential terminal, and back gates of the seventh and eighth transistors may be connected to the back gate of the first transistor, and a back gate of the 10th transistor may be connected to the second potential terminal.

As described above, the transmission gate of the present invention has a high transfer speed of a signal potential to the back gates of the first and second transistors by the first and second body effect compensation circuits upon reception of a signal at the first or second terminal, and a high signal transfer speed between the terminals.

BRIEF DESCRIPTION OF THE DRAWINGS

In the accompanying drawing.

DESCRIPTION OF THE PREFERRED EMBODIMENTS

An embodiment of the present invention will be described below with reference to the accompanying drawings.

Figure 1:
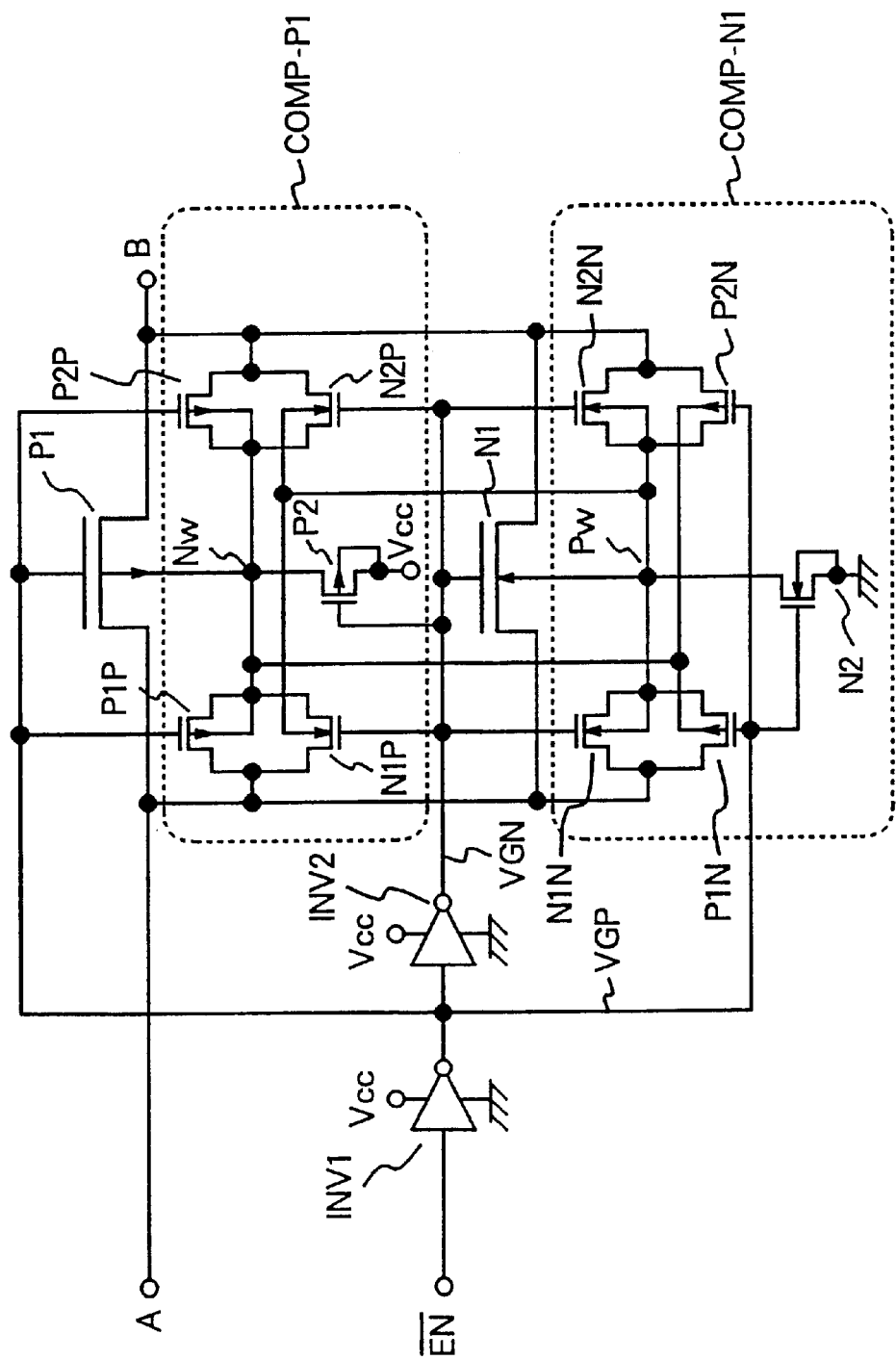
FIG. 1 is a circuit diagram showing the arrangement of a transmission gate according to the first embodiment of the present invention.
Figure 12:
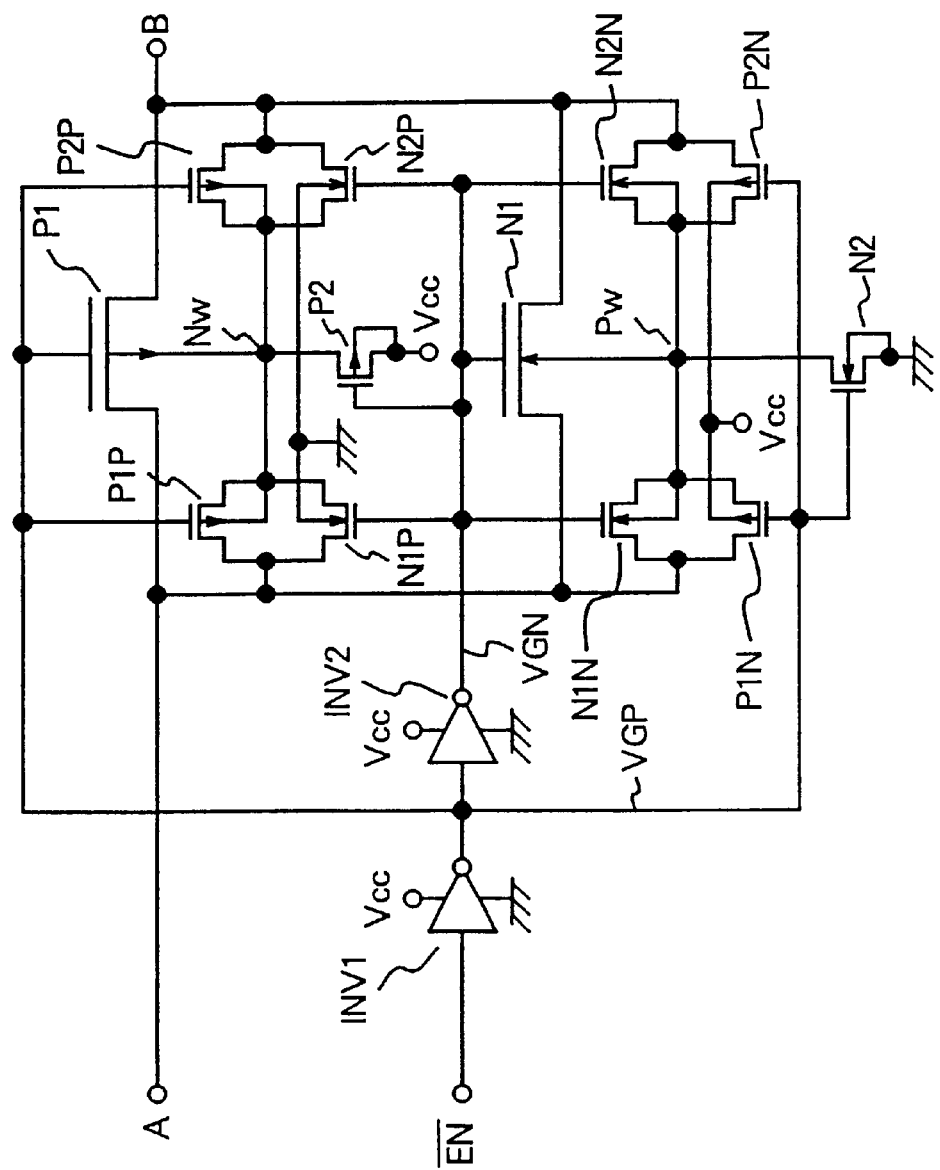
FIG. 12 is a circuit diagram showing the arrangement of still another transmission gate related to the present invention.

FIG. 1 shows the arrangement of a transmission gate according to the first embodiment of the present invention. This transmission gate is different from the transmission gate shown in FIG. 12 as follows. That is, the back gates of n-channel MOS transistors N1P and N2P included in a body effect compensation circuit COMP-P1 for a p-channel MOS transistor P1 are connected to a back gate Pw of an n-channel MOS transistor N1. The back gates of p-channel MOS transistors P1N and P2N included in a body effect compensation circuit COMP-N1 for the n-channel MOS transistor N1 are connected to a back gate Nw of the p-channel MOS transistor P1.

The operation of the first embodiment having this arrangement will be described. Upon reception of an enable signal /EN at the ground voltage, the p-channel MOS transistor P1, p-channel MOS transistors P1P and P2P, the p-channel MOS transistors P1N and P2N, the n-channel MOS transistor N1, n-channel MOS transistors N1N and N2N, and the n-channel MOS transistors N1P and N2P are turned off, and a p-channel MOS transistor P2 and an n-channel MOS transistor N2 are turned on. The p-well Pw is biased to the ground potential, and the n-well Nw is biased to the power supply voltage Vcc. As a result, the circuit between input/output terminals A and B is rendered non-conductive. Upon reception of the enable signal /EN at the power supply voltage Vcc, the p-channel MOS transistors P1, P1P, P2P, P1N, and P2N, and the n-channel MOS transistors N1, N1N, N2N, N1P, and N2P are turned on, and the p-channel MOS transistor P2 and the n-channel MOS transistor N2 are turned off. When a signal is supplied to the input/output terminal A or B, the following operation loop is established.

(1) When a signal is input to the terminal A or B, the potential of the signal is transferred to the back gate Pw of the transistor N1 and the back gate Nw of the transistor P1 respectively via the transistors N1N and N2N in the body effect compensation circuit COMP-N1 and the transistors P1N and P2N in the body effect compensation circuit COMP-P1.

(2) If the potential of the signal is transferred to the p-well Pw, it is also transferred to the back gates of the transistors N1P and N2P in the body effect compensation circuit COMP-P1 to compensate the body effect, suppress an increase in threshold voltage, and decrease the transfer resistance. This facilitates the transfer of the potential of the signal input to the terminal A or B to the back gate Nw of the p-channel MOS transistor P1 by the body effect compensation circuit COMP-P1.

(3) If the signal voltage is transferred to the back gate Nw, it is also transferred to the back gates of the p-channel MOS transistors P1N and P2N in the body effect compensation circuit COMP-N1 to compensate the body effect, suppress an increase in threshold voltage, and decrease the transfer resistance. This increases the transfer speed of the potential of the signal input to the terminal A or B to the back gate Pw of the transistor N1 by the body effect compensation circuit COMP-N1.

(4) If the signal voltage is transferred to the back gate Pw, it is transferred again to the back gates of the transistors N1P and N2P in the body effect compensation circuit COMP-P1 for the transistor P1 by the field back loop, thereby compensating the body effect, suppressing an increase in threshold voltage, and decreasing the transfer resistance. This increases the transfer speed of the potential at the terminal A or B to the back gate Nw of the transistor P1 by the body effect compensation circuit COMP-P1.

By the loop made up of (1) to (4), the driving abilities of the transistors P1N and P2N in the body effect compensation circuit COMP-N1 and the transistors N1P and N2P in the body effect compensation circuit COMP-P1 are increased without any influence of the body effect, and the signal transfer resistance is decreased. This increases the transfer speed of the voltage of the signal input to the terminal A or B to the back gates of the transistors P1 and N1. That is, the speed of the back-gate potential following upon reception of the signal at the terminal A or B increases, the body effects of the transistors P1 and N1 are transiently suppressed, and the signal transfer speed from the terminal A or B to the terminal B or A increases.

Figure 2:
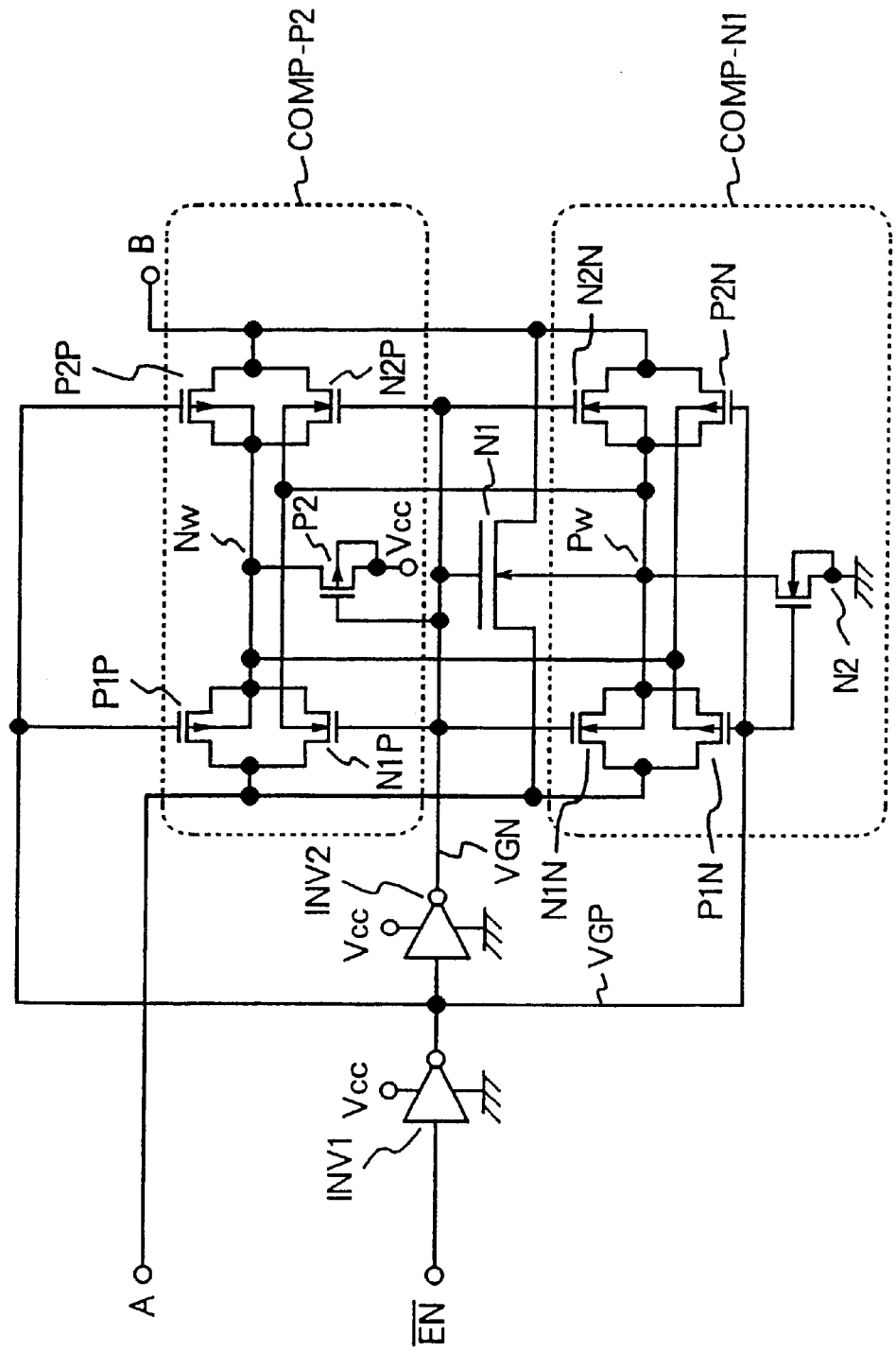
FIG. 2 is a circuit diagram showing the arrangement of a transmission gate according to the second embodiment of the present invention.

A transmission gate according to the second embodiment of the present invention has an arrangement shown in FIG. 2. The second embodiment is different from the first embodiment in the absence of the p-channel MOS transistor P1. In this case, the body effect of a transistor N1 is compensated by body effect compensation circuits COMP-N1 and COMP-P2 to increase the signal transfer speed between terminals A and B, similar to the first embodiment.

Figure 3:
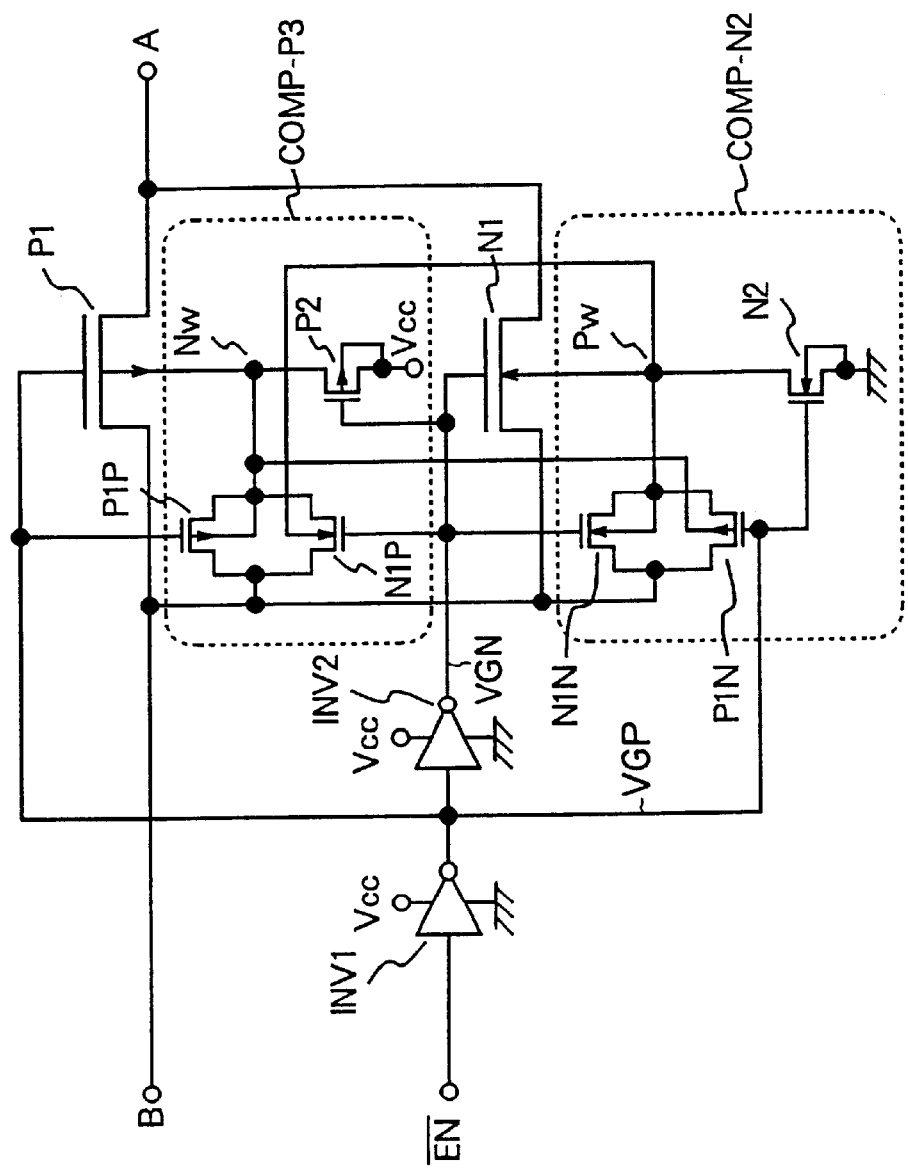
FIG. 3 is a circuit diagram showing the arrangement of a transmission gate according to the third embodiment of the present invention.

In both the first and second embodiments, the present invention is applied to a bilateral transmission gate, and a signal is bilaterally transferred between the input/output terminals A and B. To the contrary, in the third embodiment, the present invention is applied to a unilateral transmission gate, which has an arrangement shown in FIG. 3. The sources and drains of a p-channel MOS transistor P1 and an n-channel MOS transistor N1 are connected between an input terminal B and an output terminal A. A body effect compensation circuit COMP-P3 is arranged for the transistor P1, and a body effect compensation circuit COMP-N2 is arranged for the transistor N1.

The body effect compensation circuit COMP-P3 has a p-channel MOS transistor P1P, an n-channel MOS transistor N1P, and a p-channel MOS transistor P2. The body effect compensation circuit COMP-N2 has a p-channel MOS transistor P1N, an n-channel MOS transistor N1N, and an n-channel MOS transistor N2.

One terminal of each of the transistors P1P and N1P is commonly connected to the input terminal B, and the other terminal is commonly connected to the back gate of the transistor P1. The back gate of the transistor P1P is connected to that of the transistor P1. The back gate of the transistor N1P is connected to that of the transistor N1. The drain of the transistor P2 is connected to the back gate of the transistor P1, its source is connected to the power supply voltage Vcc terminal, and its gate receives an enable signal VGN. One terminal of each of the transistors N1N and P1N is commonly connected to the input terminal B, and the other terminal is commonly connected to the back gate of the transistor N1. The back gate of the transistor N1N is connected to that of the transistor N1. The back gate of the transistor P1N is connected to that of the transistor P1. The drain of the transistor N2 is connected to the back gate of the transistor N1, its source is connected to the ground terminal, and its gate receives an enable signal VGP.

In the third embodiment as well as the first and second embodiments, the back gate of the transistor N1P is connected to that of the transistor N1, and the back gate of the transistor P1N is connected to that of the transistor P1. Therefore, the voltage of a signal input to the input terminal B is transferred to the output terminal A to increase the operation speed by the body effect compensation circuits COMP-P3 and COMP-2 without any decrease in signal transfer speed.

Figure 4:
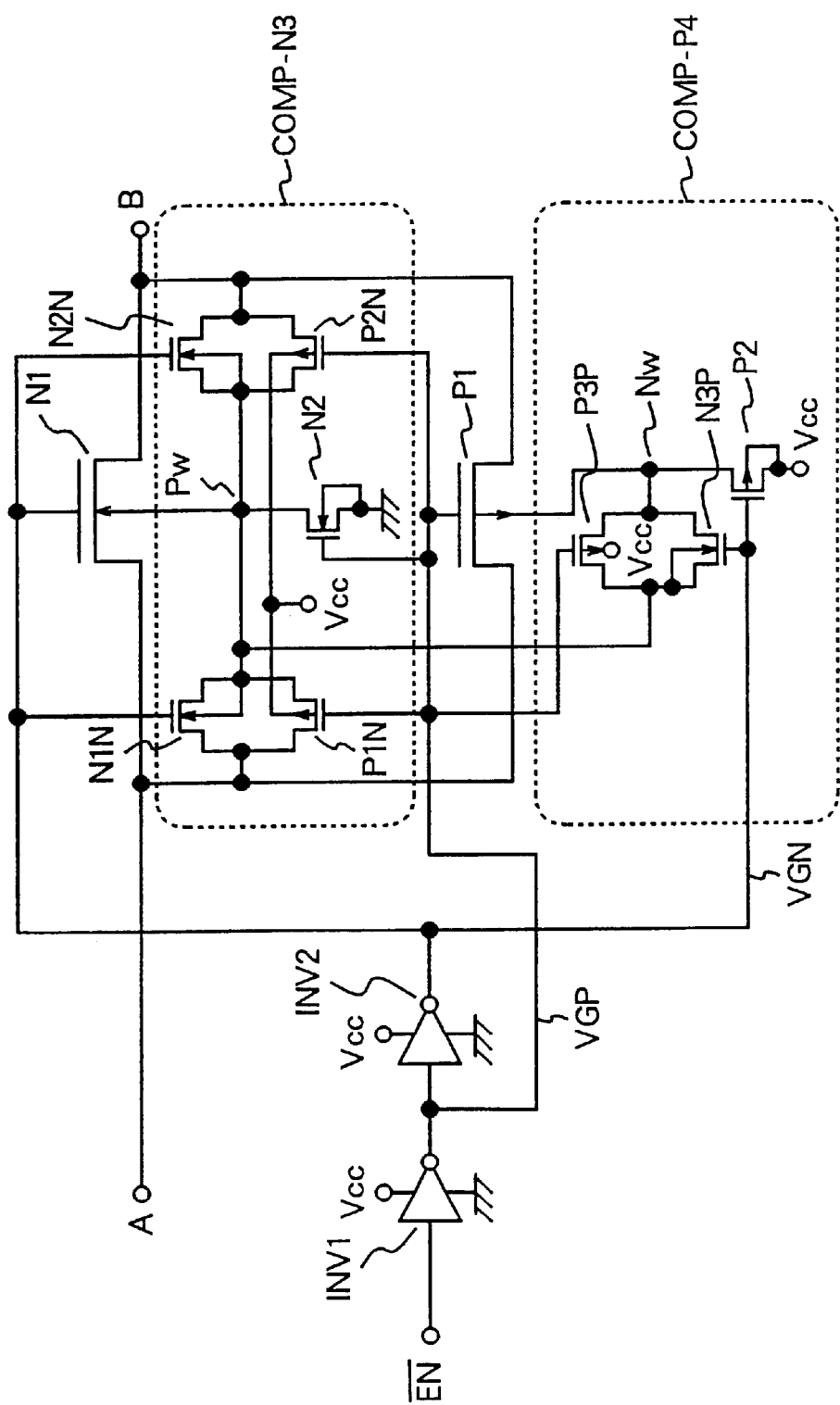
FIG. 4 is a circuit diagram showing the arrangement of a transmission gate according to the fourth embodiment of the present invention.

The fourth embodiment of the present invention will be described with reference to FIG. 4. In the first embodiment, although the body effect is compensated for the bilateral transmission gate, the total number of transistors constituting the body effect compensation circuit COMP-P1 and the transistor N1 is as large as 10. To the contrary, in the fourth embodiment, a body effect compensation circuit COMP-P4 has a different arrangement, and the total number of transistors decreases to eight. A circuit COMP-N3 in the fourth embodiment is different from the circuit COMP-N1 in the first embodiment in that the back gates of transistors P1N and P2N are connected to the power supply voltage Vcc terminal.

In the circuit COMP-P4, the transistors N1P, N2P, P1P, and P2P of the circuit COMP-Pi in the first embodiment are eliminated, and instead, transistors P3P and N3P are added. The sources and drains of the transistors P3P and N3P are commonly connected, one terminal of each of the transistors P3P and N3P is connected to the back gate of a transistor N1, and the other terminal is connected to the back gate of a transistor P1. The gate of the transistor P3P receives an enable signal VGP, and that of the transistor N3P receives an enable signal VGN. The back gate of the transistor P3P is connected to the power supply voltage Vcc terminal, and that of the transistor N3P is connected to the back gate of the transistor N1. The drain of a transistor P2 is connected to a back gate Nw of the transistor P1, its gate receives the signal VGN, and its source is connected to the power supply voltage Vcc terminal. The operation in the fourth embodiment is as follows.

Upon reception of the enable signal/EN at the ground voltage, the p-channel MOS transistors P1, P3P, P1N, and P2N, and the n-channel MOS transistors N1, N1N, N2N, and N3P are turned off, and the transistor P2 and a transistor N2 are turned on. A back gate Pw of the transistor P1 is biased to the ground potential, and the back gate Nw of the transistor P1 is biased to the power supply voltage Vcc. Accordingly, the circuit between an input terminal A and an output terminal B is rendered nonconductive.

Upon reception of the enable signal/EN at the power supply voltage Vcc, the transistors P1, P3P, P1N, P2N, N1, N1N, N2N, and N3P are turned on, and the transistors P2 and N2 are turned off. When a signal is supplied to the input or output terminal A or B, the circuit operates as follows.

(1) When a signal is input to the terminal A or B,. its potential is transferred to the back gate Pw of the transistor N1 via the transistors N1N, N2N, P1N, and P2N in the body effect compensation circuit COMP-N3. Consequently, the body effect of the transistor N1 is compensated to suppress an increase in threshold voltage and decrease the transfer resistance of the transistor N1. As a result, the signal transfer speed between the terminals A and B increases.

(2) If the potential of the signal is transferred to the back gate Pw, it is also transferred to the back gate Nw of the transistor P1 via the transistors P3P and N3P in the body effect compensation circuit COMP-P4. Accordingly, the signal potential at the terminal A or B is transferred to the back gate Nw of the transistor P1 to suppress the body effect and decrease the transfer resistance of the transistor P1. As a result, the signal transfer speed between the terminals A and B increases.

Figure 5:
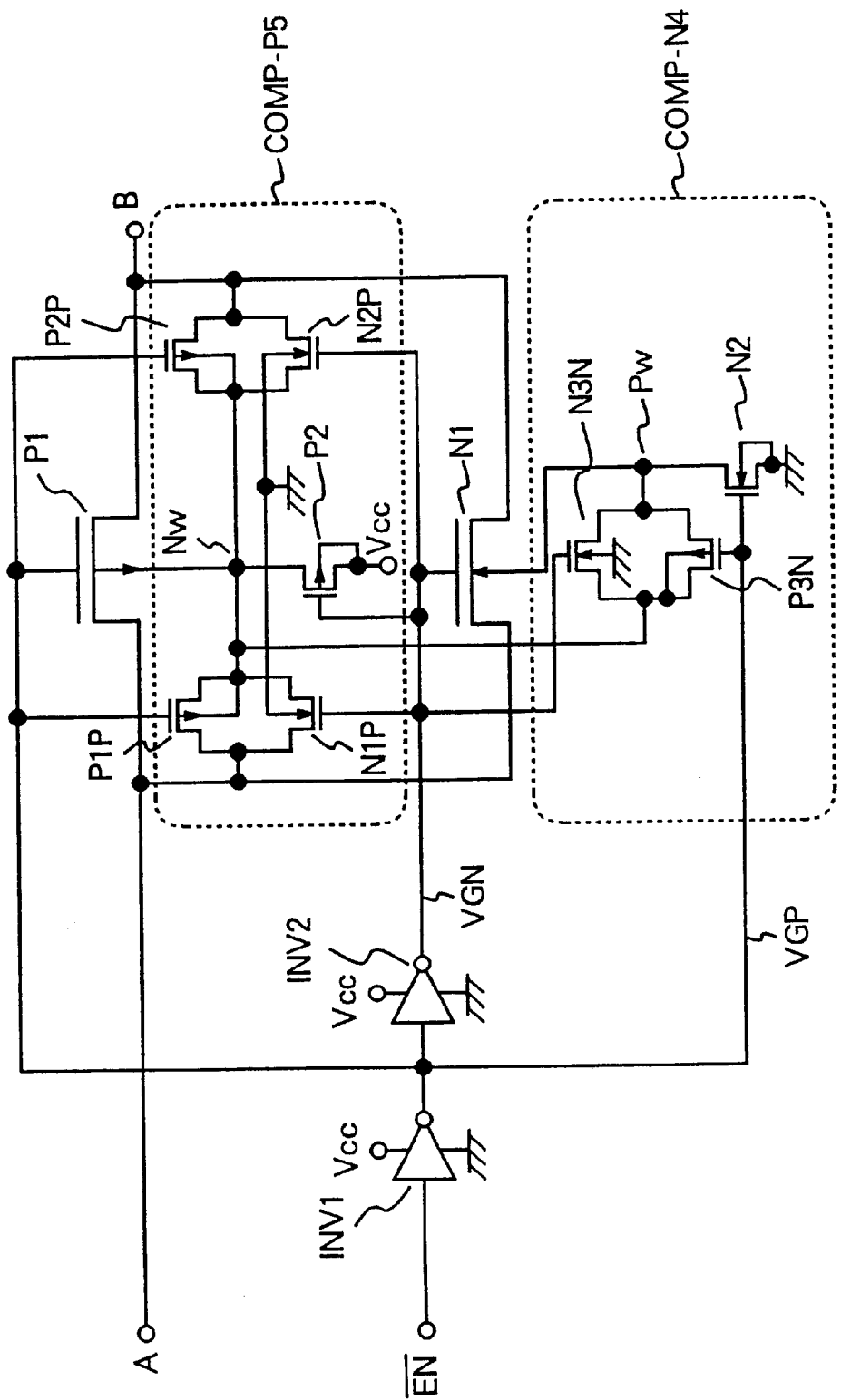
FIG. 5 is a circuit diagram showing the arrangement of a transmission gate according to the fifth embodiment of the present invention.

The fifth embodiment of the present invention has an arrangement shown in FIG. 5. The fifth embodiment is equivalent to an arrangement in which the conductivity types in the fourth embodiment are reversed. More specifically, in the circuit COMP-P4 of the fourth embodiment, the transistors N1P, N2P, P1P, and P2P of the circuit COMP-P1 in the first embodiment are eliminated, and the transistors P3P and N3P are added. To the contrary, according to the fifth embodiment, a circuit COMP-P5 is constituted similarly to the circuit COMP-P1 in the first embodiment, and in a circuit COMP-N4, the transistors N1N, N2N, P1N, and P2N in the circuit COMP-N1 of the first embodiment are eliminated while transistors N3N and P3N are added.

Also in the fifth embodiment, the potential of a signal input to a terminal A or B is transferred to a back gate Nw of a p-channel MOS transistor P1, and further to a back gate Pw of a transistor N1 via the transistors N3N and P3N in the body effect compensation circuit COMP-N4. Therefore, similar to the fourth embodiment, a decrease in driving ability of the transistor caused by the body effect can be prevented to increase the signal transfer speed.

Figure 6:
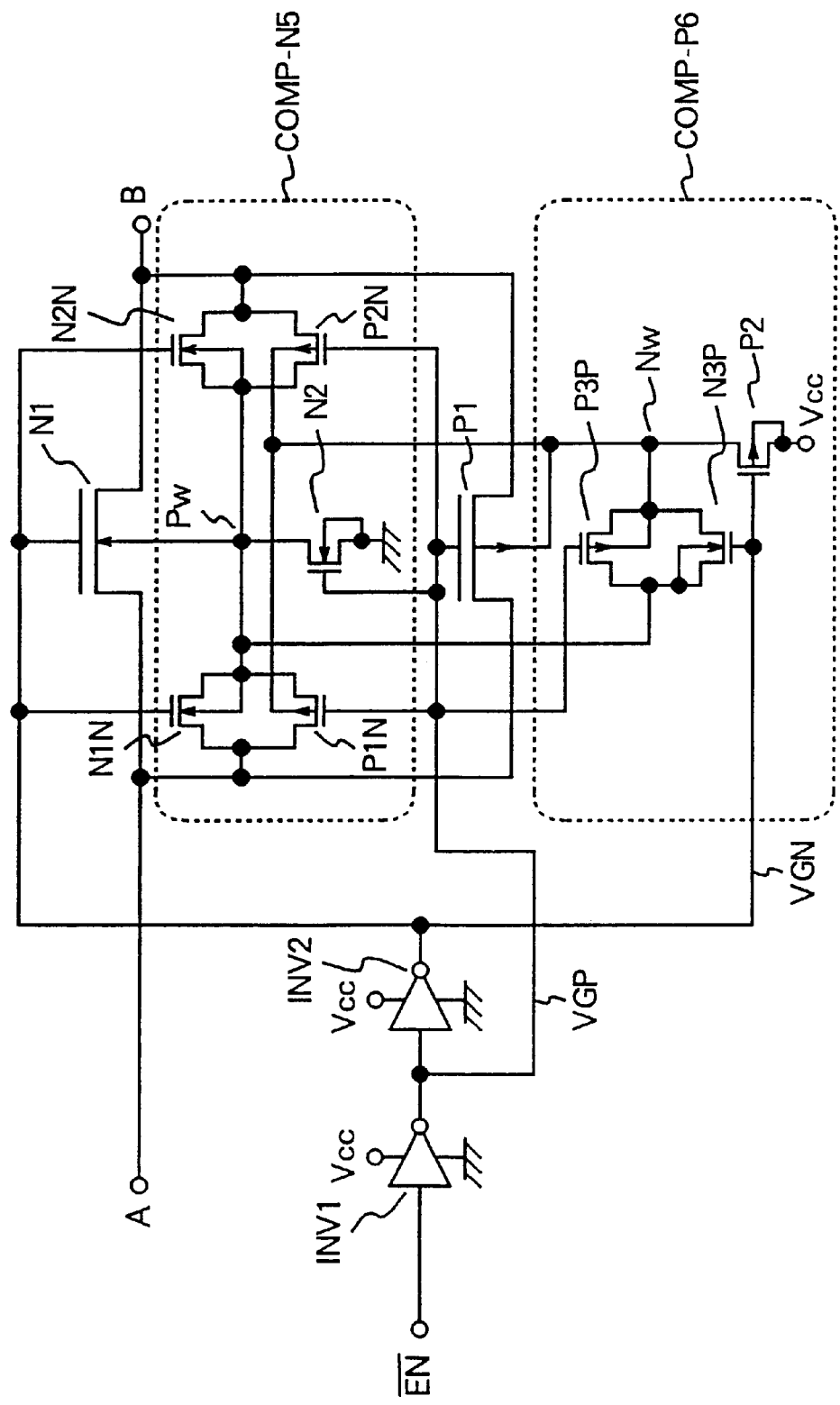
FIG. 6 is a circuit diagram showing the arrangement of a transmission gate according to the sixth embodiment of the present invention.

The sixth embodiment of the present invention has an arrangement shown in FIG. 6. The sixth embodiment is a modification of the fourth embodiment shown in FIG. 4. In the fourth embodiment, the back gate of the transistor P3P in the circuit COMP-P4 is connected to the power supply voltage Vcc terminal. In contrast, in the sixth embodiment, the back gate of a transistor P3P is connected to a back gate Nw of a transistor P1. Further, in the fourth embodiment, the back gates of the transistors P1N and P2N in the circuit COMP-N3 are connected to the power supply voltage Vcc terminal, but in the sixth embodiment, the back gates of transistors P1N and P2N are connected to the back gate Nw of the transistor P1. The operation in the sixth embodiment is as follows.

(1) The voltage of a signal input to a terminal A or B is transferred to a back gate Pw of a transistor N1 via transistors N1N and N2N and the transistors P1N and P2N in a circuit COMP-N5. Then, the body effect is suppressed in the transistor N1 to hardly increase the threshold and decrease the transfer resistance.

(2) The potential transferred to the back gate Pw is transferred to the back gate Nw of the transistor P1 via a transistor N3P and the transistor P3P in a circuit COMP-P6. Accordingly, the body effect is suppressed in the transistor P1 not to increase the threshold voltage and to decrease the transfer resistance.

(3) The potential transferred to the back gate Nw of the transistor P1 is transferred to the back gates of the transistors P1N and P2N in the circuit COMP-N5 to further suppress the body effect. This further increases the transfer speed of the signal voltage applied to the terminal A or B to the back gate Pw of the transistor N1 by the circuit COMP-N5.

(4) The potential transferred to the back gate Pw is transferred again to the back gate Nw of the transistor P1 via the circuit COMP-P6 to further suppress the body effect and further increase the transfer speed.

In this manner, the driving abilities of the transistors P1N and P2N in the circuit COMP-N5 and the transistor P3P in the circuit COMP-P6 are increased by the feedback loop made up of (1) to (4) without any influence of the body effect, and the resistance in transferring a signal decreases. For this reason, compared to the circuit example in FIG. 4, the transfer speed of the potential at the terminal A or B to the back gate Nw of the transistor P1 and the back gate Pw of the transistor N1 increases to increase the signal transfer speed between the terminals A and B.

Figure 7:
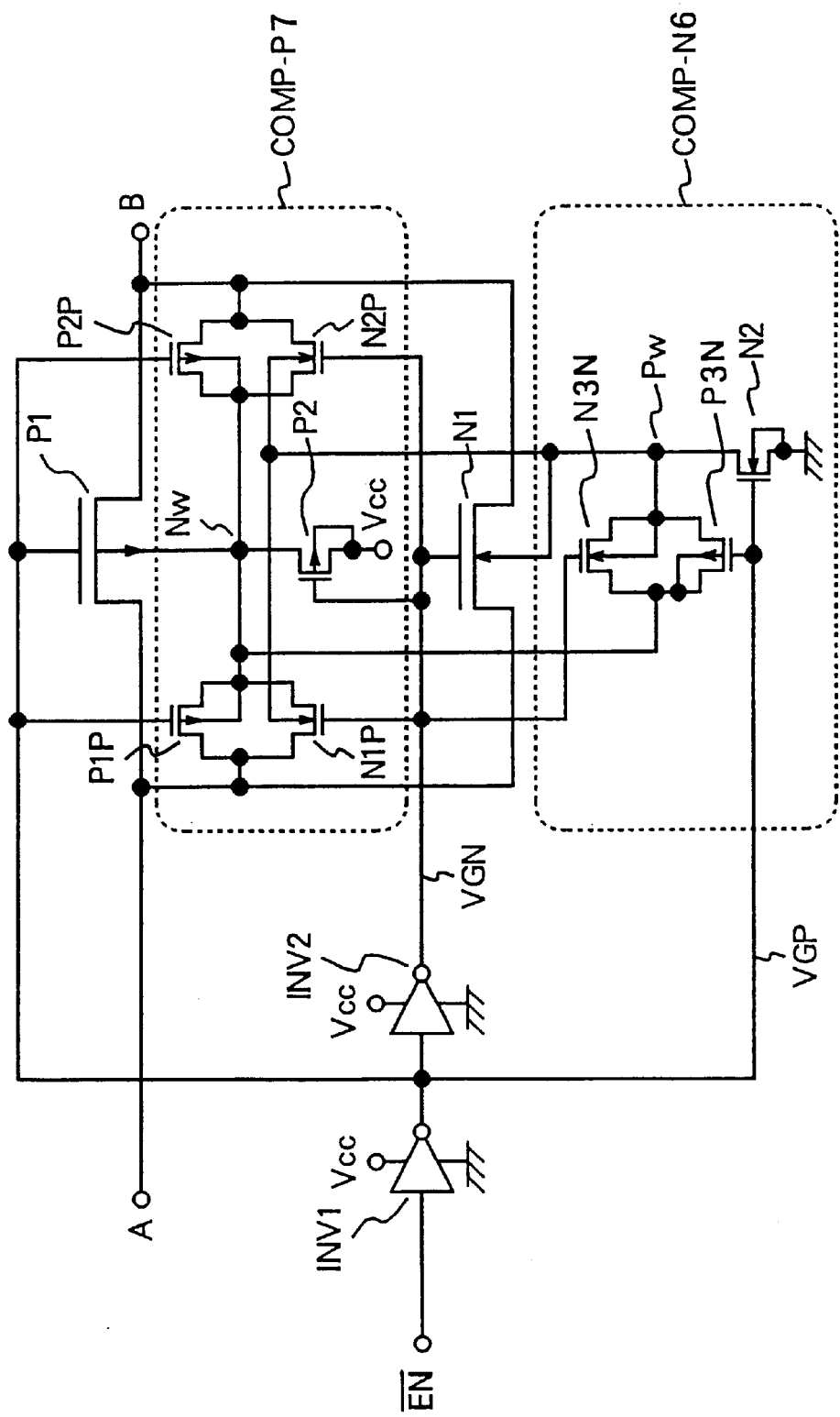
FIG. 7 is a circuit diagram showing the arrangement of a transmission gate according to the seventh embodiment of the present invention.
Figure 8:
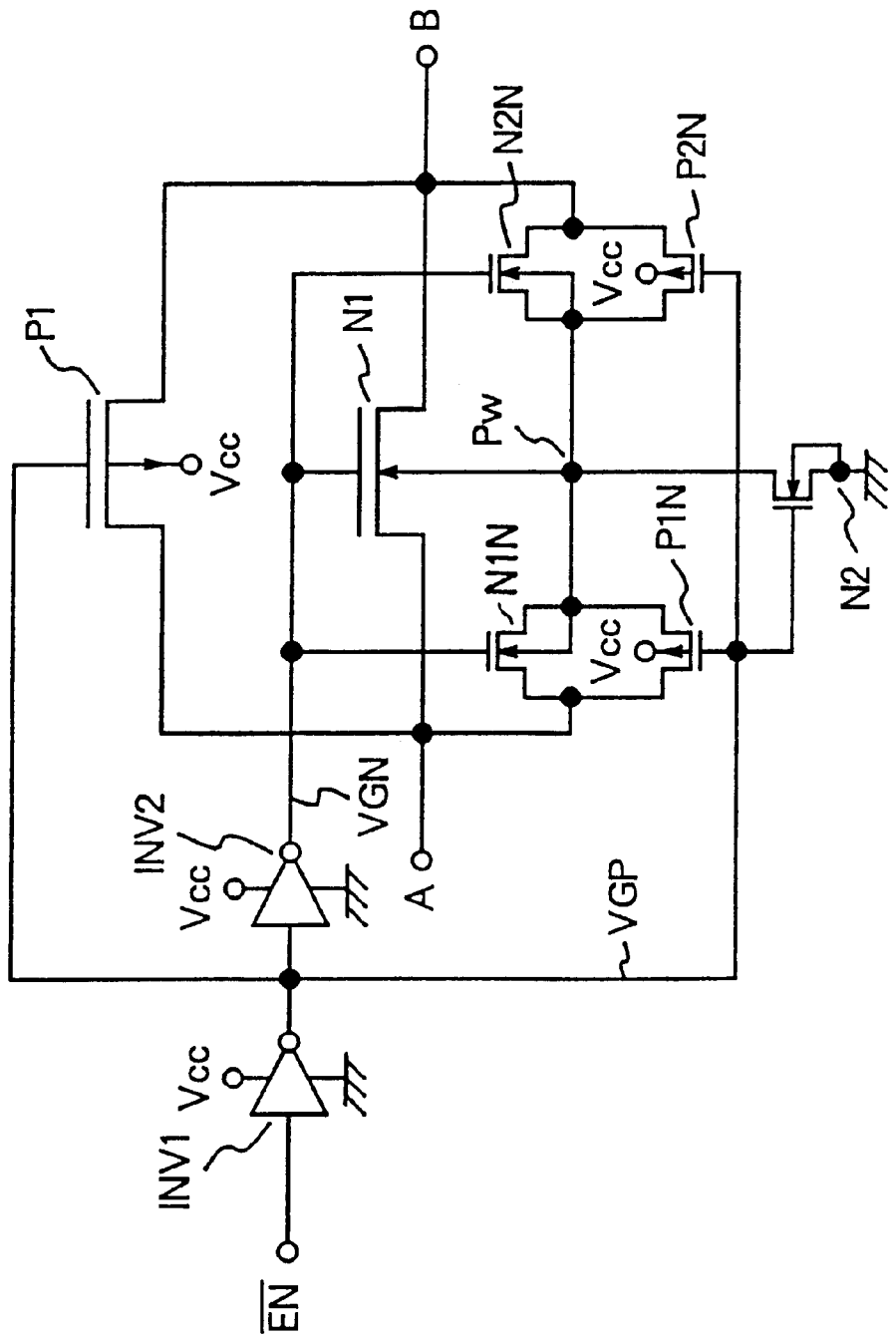
FIG. 8 is a circuit diagram showing the arrangement of a transmission gate related to the present invention.
Figure 9:
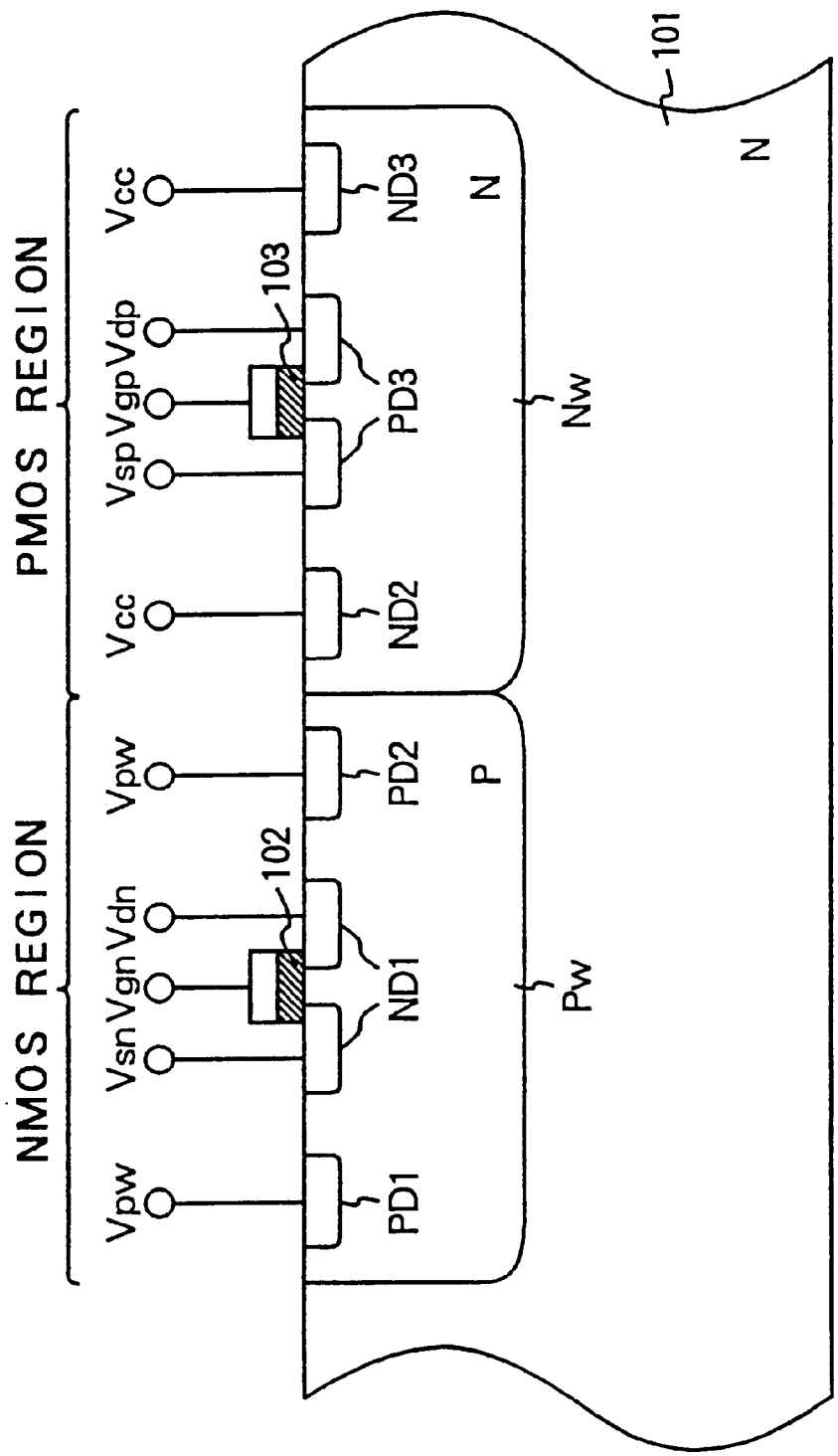
FIG. 9 is a longitudinal sectional view showing the well structure of a semiconductor substrate for forming the transmission gate shown in FIG. 8.
Figure 10:
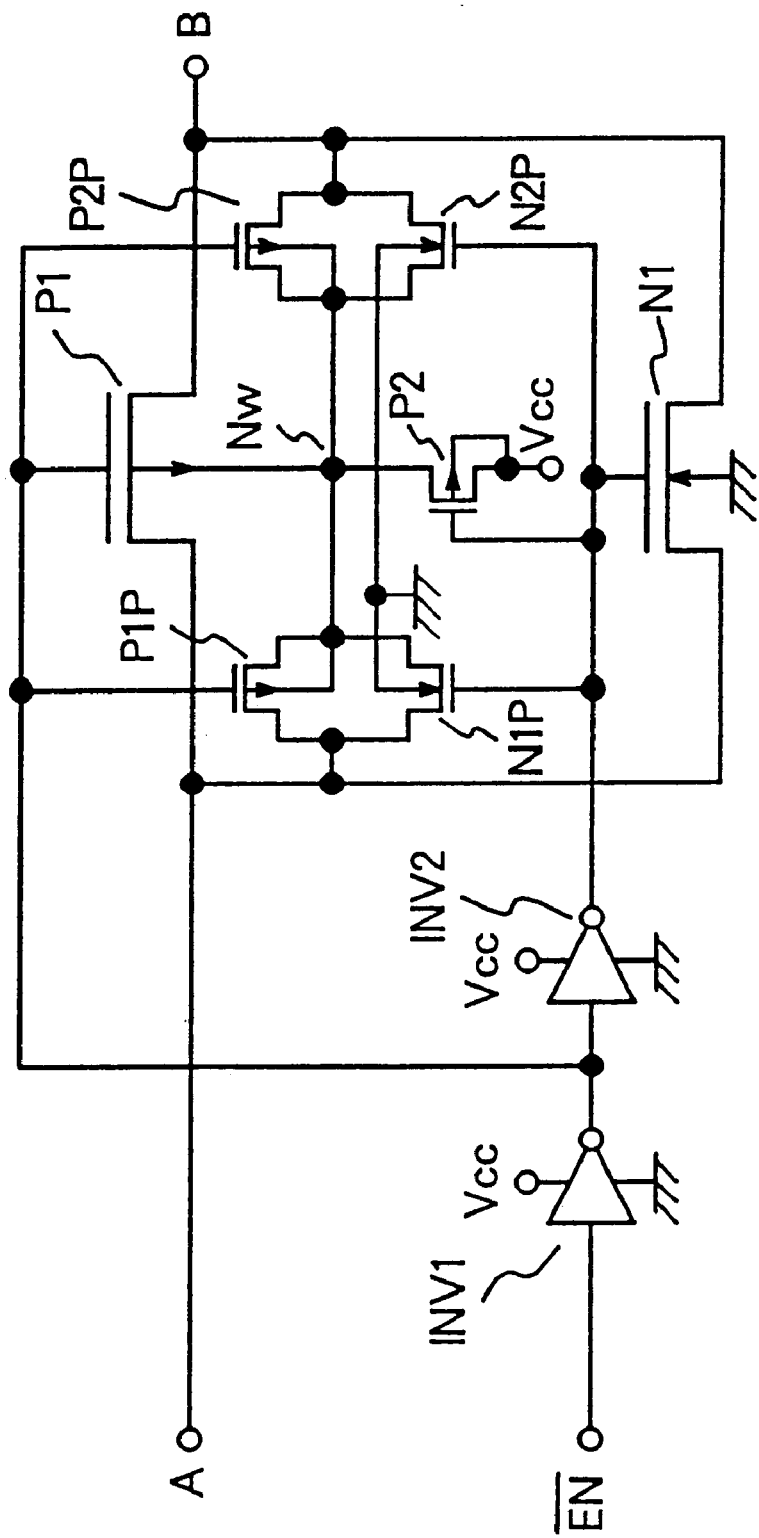
FIG. 10 is a circuit diagram showing the arrangement of another transmission gate related to the present invention.

The seventh embodiment of the present invention has an arrangement shown in FIG. 7. The seventh embodiment is a modification of the fifth embodiment shown in FIG. 5. In the circuit COMP-N4 shown in FIG. 5, the back gate of the transistor N3N is grounded. To the contrary, in a circuit COMP-N6 of the seventh embodiment, the back gate of a transistor N3N is connected to a back gate Pw of a transistor N1. Also, in the circuit COMP-P5 of FIG. 5, the back gates of the transistors N1P and N2P are grounded, but in a circuit COMP-P7 of the seventh embodiment, the back gates of transistors N1P and N2P are connected to a back gate Pw of a transistor N1.

In the seventh embodiment as well as the sixth embodiment as a modification of the fourth embodiment, the feedback loop operates to compensate the body effect, resulting in a higher signal transfer speed than that in the circuit example of FIG. 5.

Figure 11:
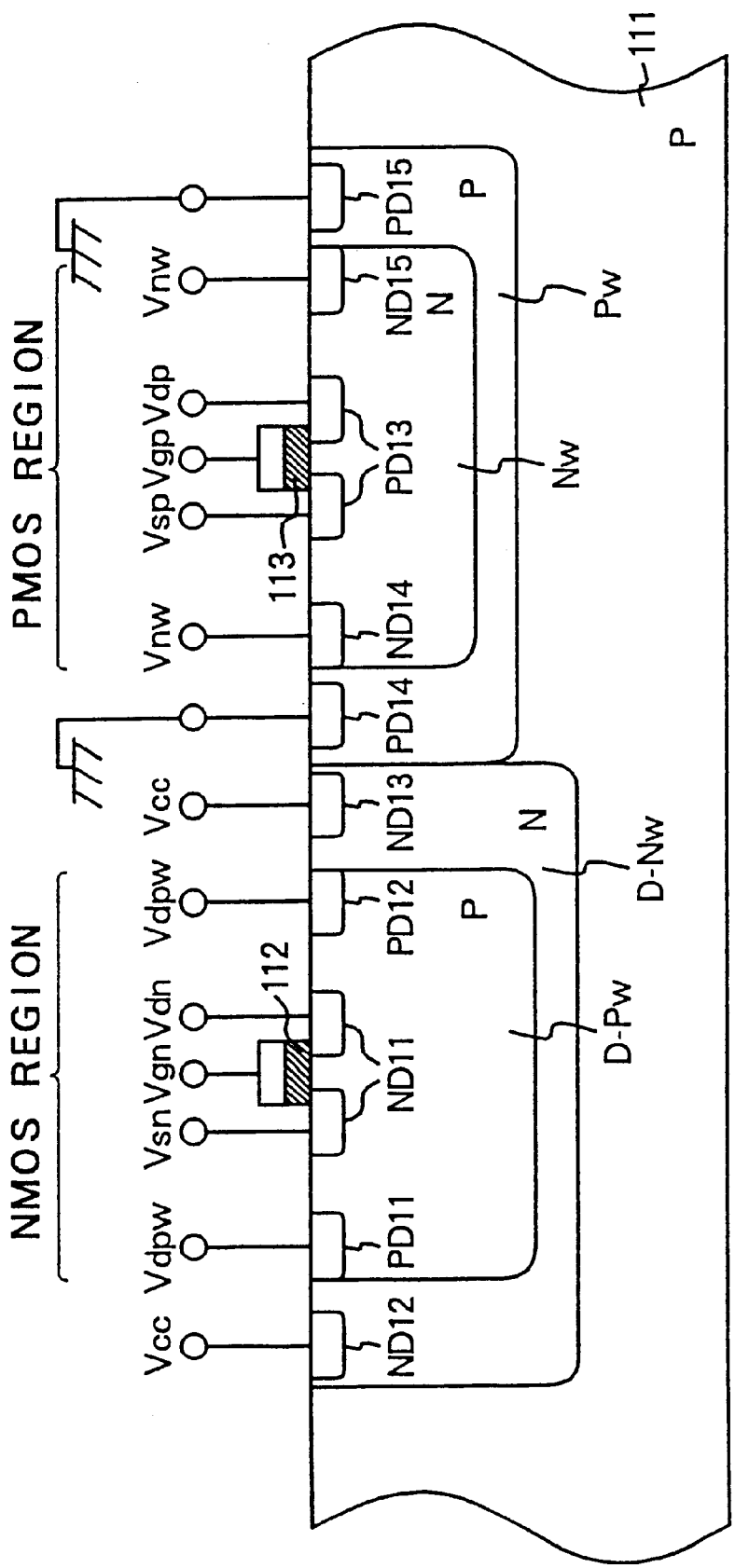
FIG. 11 is a longitudinal sectional view showing the triple well structure of a semiconductor substrate capable of forming the transmission gate of the present invention.

The above-described embodiments are merely examples, and do not limit the present invention. Each of the first to seventh embodiments can be realized by a triple well structure in which a deep n-well D-Nw is formed in a p-type semiconductor substrate 111 like the one shown in FIG. 11, and a p-well D-Pw is formed in the n-well D-Nw. However, each embodiment may employ a triple well structure in which the conductivity types are reversed, a deep p-well D-Pw is formed in an n-type semiconductor substrate, and an n-well D-Nw is formed in the p-well D-Pw. That is, each embodiment can adopt any triple well structure as far as the back gate potentials of a plurality of p-channel MOS transistors and those of a plurality of n-channel MOS transistors that constitute a body effect compensation circuit can be independently set.

In the first embodiment, the transistor is controlled using the enable signal/EN inverted or not inverted by inverters INV1 and INV2 However, the present invention is not limited to this arrangement so far as the conductive state of the transistor can be controlled.

What is claimed is:

1. A transmission gate comprising:
   first and second terminals;
   a first transistor of a first conductivity type which has a drain and source connected between said first and second terminals, and is rendered conductive by a first signal;
   a second transistor of a second conductivity type which has a drain and source connected between said first and second terminals, and is rendered conductive by a second signal corresponding to an inverted signal of a said first signal;
   a first body effect compensation circuit for reducing the difference between a potential of a back gate and a potential of the source of said first transistor when said first transistor is ON; and
   a second body effect compensation circuit for reducing the difference between a potential of a back gate of said second transistor and a potential of the back gate of said first transistor when said second transistor is ON;
   wherein said first body effect compensation circuit includes a third transistor of the second conductivity type having a drain and source connected between the back gate of said first transistor of the second conductivity type having a drain and source connected between the back gate of said first transistor and said first terminal, and a fourth transistor of the second conductivity type have a drain and source connected between the back gate of said first transistor and said second terminal, and
   said second body effect compensation circuit includes a fifth transistor of the second conductivity type having a drain and source connected between the back gate of said second transistor and the back gate of said first transistor, and a sixth transistor of the first conductivity type having a drain and source connected between the back gate of said second transistor and the back gate of said first transistor;
   wherein back gates of both said third, fourth and fifth transistors are connected to the back gate of said second transistor, and a back gate of said sixth transistor is connected the back gate of said first transistor.

2. A gate according to claim 1, wherein said first body effect compensation circuit connects the back gate of said first transistor to a first potential terminal when said first transistor is OFF, and
   said second body effect compensation circuit connects the back gate of said second transistor to a second potential terminal when said second transistor is OFF.

3. A gate according to claim 2, wherein said first body effect compensation circuit further comprises a seventh transistor of the first conductivity type which has a drain and source connected between said first terminal and the back gate of said first transistor and receives the first signal at a gate, an eighth transistor of the first conductivity type which has a drain and source connected between the back gate of said first transistor and said second terminal and receives the first signal at a gate, and a ninth transistor of the first conductivity type which has a drain and source connected between the back gate of said first transistor and said first potential terminal and receives the second signal at a gate, said second body effect compensation circuit further comprises a 10th transistor of the second conductivity type which has a drain and source connected between the back gate of said second transistor and said second potential terminal and receives the first signal at a gate, and back gates of said seventh and eighth transistors are connected to the back gate of said first transistor, a back gate of said ninth transistor is connected to said first potential terminal, and a back gate of said 10th transistor is connected to said second potential terminal.

* * * * *